United States Patent [19]

Sterler et al.

[11] Patent Number: 4,853,623
[45] Date of Patent: Aug. 1, 1989

[54] METHOD FOR TESTING AIRBAG SYSTEM RELEASE CIRCUIT

[75] Inventors: Georg Sterler, Grossmehring; Heinz Bader, Karlshuld, both of Fed. Rep. of Germany

[73] Assignee: Audi AG, Fed. Rep. of Germany

[21] Appl. No.: 268,644

[22] Filed: Nov. 8, 1988

Related U.S. Application Data

[63] Continuation of Ser. No. 17,236, Feb. 20, 1987, abandoned.

[30] Foreign Application Priority Data

Feb. 28, 1986 [DE] Fed. Rep. of Germany ....... 3606567

[51] Int. Cl.[4] .................... G01R 31/00; B60R 21/02; B62D 45/00
[52] U.S. Cl. ........................... 324/158 R; 324/73 R; 340/425.5; 340/436; 280/735
[58] Field of Search ............. 324/158 R, 73 R; 340/52 H, 515, 52 R; 280/707, 730, 741, 743, 735; 307/354, 362, 363; 328/146, 147; 73/1 D

[56] References Cited

U.S. PATENT DOCUMENTS 3,911,391 10/1975 Held et al. .................. 280/735 X
4,243,971 6/1981 Suchowerskyj et al. ........ 340/52 H
4,410,875 10/1983 Spies et al. .................. 280/735 X
4,608,501 8/1986 Andres et al. ............... 340/52 H X
4,638,179 1/1987 Mattes et al. ............... 340/52 H X

FOREIGN PATENT DOCUMENTS 2222038 11/1977 Fed. Rep. of Germany .
2808872 9/1979 Fed. Rep. of Germany .

Primary Examiner—Reinhard J. Eisenzopf
Assistant Examiner—Vinh P. Nguyen
Attorney, Agent, or Firm—Lalos & Keegan

[57] ABSTRACT

A method for testing an airbag release circuit for proper operation using a single test pulse. A single test pulse of predetermined form is delivered to the circuit in place of an accelerometer signal. The form of the test pulse permits determination of an expected resultant circuit output signal. The actual circuit output signal is compared to the expected signal to confirm or deny proper operation of the circuit. The test pulse can be modified to different forms to test individual aspects of the circuit.

6 Claims, 1 Drawing Sheet

METHOD FOR TESTING AIRBAG SYSTEM RELEASE CIRCUIT

This is a continuation of co-pending application Ser. No. 017,236 filed on Feb. 20, 1987 now abandoned.

This invention relates to an electronic circuit for releasing an airbag (e.g. located in the dash assembly of an automobile) and more particularly to a method for testing the operability of the airbag release circuit.

While safety belts still provide the primary means for ensuring occupant safety in automobiles, airbags have been installed on more expensive cars and may be mandatory on all automobiles in the future.

Airbag release circuits are centered around an accelerometer, which senses inertial reaction to measure linear or angular acceleration. The release circuit is responsive to the signal generated by the accelerometer. If this signal is greater than a predetermined threshold value, indicating sudden acceleration or deceleration, the release circuit activates the airbag thus protecting the occupant of the vehicle.

Given the importance of the airbag release system to human safety, it is desirable to provide a system for effectively checking its operation. In prior art systems, (e.g. shown in DE-AS No. 22 22 038) individual components of the release circuit were tested by supplying separate test pulses to each component and then evaluating the output of each component to determine its operability. However, this type of test arrangement is expensive and time consuming and may have a cost impact on lower priced automobiles employing an airbag.

Accordingly, it is an object of the present invention to provide an improved method for testing the operability of an airbag release circuit.

A further object of the present invention is to provide an improved testing method in which components of an airbag release circuit can be tested with minimum cost and time.

A still further object of the present invention is to provide an improved testing method in which a single test pulse is delivered to the release circuit to test the overall operation of the circuit.

A further object of the present invention is to provide an improved testing method in which the form and duration of a single pulse delivered to the release circuit can be modified to test separate aspects of the release circuit.

Other objects and advantages of the present invention will become more apparent to those persons having ordinary skill in the art to which the present invention pertains from the following description taken in conjunction with the accompanying drawings in which:

FIG. 2b is a graph illustrating the form of a signal resulting from integration of the test pulse shown in FIG. 2a.

FIG. 3b is a graph illustrating the form of a signal resulting from integration of the test pulse shown in FIG. 3a.

FIG. 4b is a graph illustrating the form of a signal resulting from integration of the test pulse shown in FIG. 4a.

Figure 1:
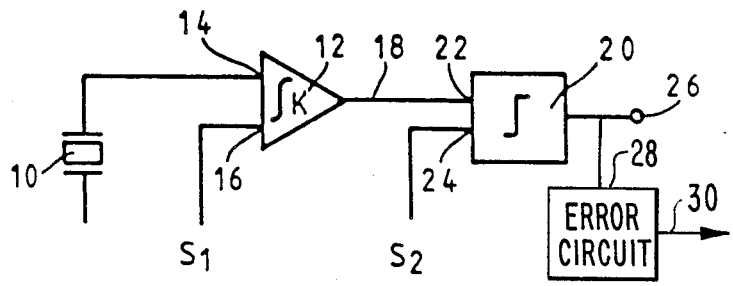
FIG. 1 is a schematic representation of the airbag release circuit to be tested by the method of the present invention.

Referring to FIG. 1, a schematic representation of the airbag release circuit is shown. An accelerometer 10 generates a signal when a strong acceleration or deceleration is sensed in the vehicle. The value of the signal generated will depend on the strength of the acceleration or deceleration sensed.

The accelerometer signal is provided to integrator 12 through integrator input 14. A second integrator input 16 receives a signal of a fixed, predetermined value S1. The value of signal S1 is a threshold value that determines when the integrator 12 will be activated. Integrator 14 will be activated only if the signal on input 14 is greater than threshold value S1.

When the signal on input 14 (accelerometer signal) becomes greater than threshold value S1, the integrator 12 begins to integrate the signal on input 14 with an integration constant k (less than 1).

The reduced integration signal from output 18 of integrator 12 is provided to threshold switch 20 through switch input 22. A second input 24 on switch 20 receives a second signal of fixed, predetermined value S2. The value of S2 is also a threshold value. It determines when switch 20 will be responsive to a signal on input 22 to pass the signal on input 22 to the output of the switch.

If the signal from integrator 12 on line 18 is of a value that exceeds the threshold value S2, switch 20 will deliver a signal on its output 26. In an airbag release system in a motor vehicle, the signal delivered at output 26 serves to release the airbag.

A faulty airbag release system presents an obvious safety hazard. It is therefore desirable to check the operation of the system at regular intervals.

In accordance with the method of the present invention, a test pulse is delivered to input 14 of integrator 12 in substitution for the signal generated by the accelerometer 10. The accelerometer 10 is disconnected from the system and is replaced with a suitable pulse generator of which many are known in the art. The output 26 of switch 26 is also disconnected from the airbag release mechanism for test purposes. The output 26 can be connected to a suitable device for observing the signal on output 26, e.g. an oscilloscope. The test pulse generator can also be connected to a standard oscilloscope so that the input test pulse signal and output signal can be observed and/or recorded simultaneously. If the test pulse signal of a predetermined amplitude and duration caused an output signal at output 26, as expected, the overall circuit is operable.

In accordance with the present invention, operability of the airbag release circuit can be verified with a single test pulse if the amplitude and duration of the pulse are properly selected. Unlike the test apparatus of the prior art, separate elements do not have to be tested individually by providing a separate input test pulse for each element and observing the output for each element.

Figure 2A:
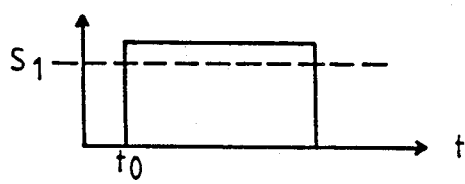
FIG. 2a is a graph illustrating the form of the test pulse in a first embodiment of the present invention.

Referring to FIG. 2a, a first form of a test pulse used in the present invention is shown. The rectangular pulse shown in FIG. 2a is chosen to be of an amplitude greater than S1 and of sufficient duration that the reduced integration of the test signal will be sufficient to enable switch 20 (i.e. amplitude of input signal on switch input 22 will be greater than threshold value S2).

Figure 2B:
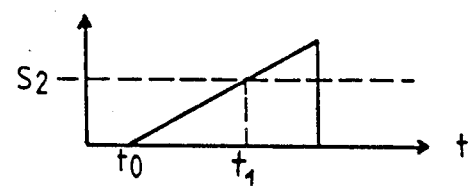

As shown in FIG. 2a, a signal greater than threshold value S1 is delivered to input 14 of integrator 12 at time t0. Integrator 12, if operating properly, will begin to immediately integrate the test signal and will generate an output signal at output 18, the form of which will be a continually rising sawtooth. The amplitude of the sawtooth signal will exceed threshold value S2 at time t1 (FIG. 2b) which results in threshold switch 20 providing an output signal at time t1. By the method of the present invention, provision of the rectangular pulse of predetermined amplitude and duration permits the entire circuit, including the integrator and switch to be tested. The circuit is determined to be operable if a test pulse corresponding to that represented in FIG. 2a results in a signal at output 26 after a period of t1-t0.

Figure 3A:
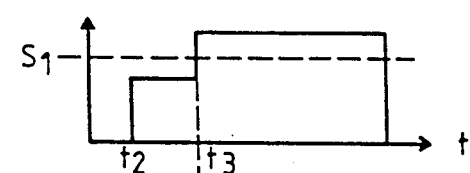
FIG. 3a is a graph illustrating the form of the test pulse in a second embodiment of the present invention.
Figure 3B:
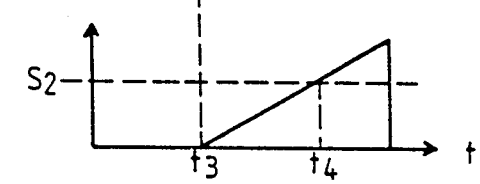

By utilizing the method of the present invention, the setting of threshold value S1 can be checked. Referring to FIG. 3a, a rectangular test pulse of an amplitude less than S1 is input to integrator 12 at time t2. At time t3, the amplitude of the test pulse is increased to a value above S1. If operating properly, integrator 12 will begin to integrate at time t3 (FIG. 3b), corresponding to the value of the test pulse increasing above S1. The integrator 12 output signal will gradually rise to an amplitude exceeding threshold value S2 at time t4. Switch 20 will then be activated producing a signal at output 26, providing the circuit is operational. By providing an input signal that is both above and below threshold value S1 and monitoring the output 26, it can be determined if the integrator threshold value S1 is properly set. Integration should only occur after time t3. If a signal is received at output 26 before t4, it is an indication that the integrator threshold value S2 is set low.

Figure 4A:
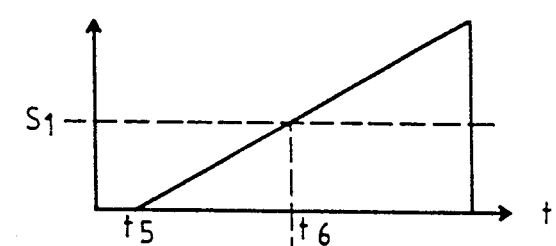
FIG. 4a is a graph illustrating the form of a test pulse in a third embodiment of the present invention.
Figure 4B:
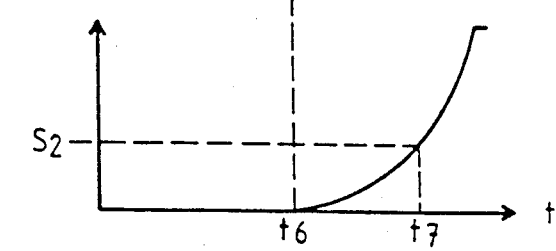

FIG. 4a shows another test pulse in the form of a sawtooth. At time t6, threshold value S1 is exceeded and the integrator 20 will begin to integrate (FIG. 4b). At time t7, the signal on integrator output 18 will exceed threshold value S2 thereby enabling switch 20.

In testing the release circuit of FIG. 1 with a single test pulse, errors resulting in reciprocal compensation may go undetected. For example, a shift in threshold value S1 may be compensated for in a shift in threshold value S2. If, however, the integrator output 18 is observed while testing the circuit, threshold value S2 can be determined independently. Switch 20 will be enabled when the integrator output 18 reaches threshold value S2. Further, by observing when integrator 12 begins to produce an output signal and utilizing the gradually increasing test pulse of FIG. 4a, threshold value S1 can also be determined independently. Compensating errors can thereby be detected using the method of the present invention.

In each of the embodiments of the test signal shown in FIGS. 2, 3, and 4, the time at which a signal should be produced at output 26 can be predetermined knowing the amplitude and form of the test pulse. Further, a suitable circuit 28 can be connected to the switch output 26 to produce an error signal 30 if a switch output signal is not produced at the predetermined time.

From the foregoing detailed description, it will be evident that there are a number of changes, adaptations and modifications of the present invention which come within the province of those persons having ordinary skill in the art to which the aforementioned invention pertains. However, it is intended that all such variations not departing from the spirit of the invention be considered as within the scope thereof as limited solely by the appended claims.

We claim:

1. A method for testing a circuit for releasing an airbag comprising an accelerometer, an integrator for receiving a signal from the accelerometer, said integrator being conditioned by a signal having a first threshold value such that said integrator integrates a signal received from said accelerometer only if said accelerometer signal exceeds said first threshold value, a switch for receiving a signal from said integrator and for producing a switch output signal, said switch being conditioned by a signal having a second threshold value such that said switch produces said output signal only if said integrator signal exceeds said second threshold value, said method comprising the steps of delivering a single test pulse signal to said integrator in place of said accelerometer signal, said single test pulse signal being delivered to said integrator over a given time period, and the amplitude of said single test pulse being greater than said first threshold value for at least a portion of said time period, said single test pulse exceeding said first threshold value at a predetermined first point in said time period, said single test pulse exceeding said first threshold value for at least a portion of said time period sufficient for said integrator to produce an integrator output signal having a magnitude greater than said second threshold value, and monitoring the output of said switch whereby proper operation of said circuit is confirmed if said switch produces a switch output signal at a predetermined second point in time directly related to said first point in said time period, and further independently checking said first threshold value by selecting a single test pulse of a predetermined first form and monitoring said integrator output signal, and independently checking said second threshold value by selecting a single test pulse of said predetermined first form and monitoring said switch output signal and said integrator output signal.

2. The method for testing a circuit according to claim 1 wherein said test pulse is of a constant amplitude greater than said first threshold value.

3. The method for testing a circuit according to claim 1 wherein said test pulse is of an amplitude less than said first threshold value for a first predetermined time period and is of an amplitude greater than said first threshold value after said first predetermined time period has expired.

4. The method of testing a circuit according to claim 3 wherein said test pulse is in the form of a sawtooth.

5. The method of testing a circuit according to claims 3 or 4 wherein said test pulse exceeds said first threshold value at said predetermined first point in time and wherein said integrator output signal exceeds said second threshold value at a point in time that is determined from said first predetermined point in time.

6. The method of testing a circuit according to claim 5 wherein an error signal is generated if said switch fails to produce an output signal at said predetermined second point in time.

* * * * *